(12) United States Patent
Matsuyama et al.

(10) Patent No.: US 8,166,087 B2
(45) Date of Patent: Apr. 24, 2012

(54) MICROPROCESSOR PERFORMING IIR FILTER OPERATION WITH REGISTERS

(75) Inventors: Hideki Matsuyama, Kanagawa (JP); Masayuki Daito, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 912 days.

(21) Appl. No.: 12/216,962

(22) Filed: Jul. 14, 2008

(65) Prior Publication Data
US 2009/0030961 A1    Jan. 29, 2009

(30) Foreign Application Priority Data
Jul. 26, 2007   (JP) .................. 2007-194036

(51) Int. Cl.
*G06F 17/10*    (2006.01)
(52) U.S. Cl. ............. 708/320; 708/303; 708/300
(58) Field of Classification Search .......... 708/209, 708/300–323
See application file for complete search history.

(56) References Cited

U.S. PATENT DOCUMENTS

| | | | | |
|---|---|---|---|---|
| 6,122,653 A * | 9/2000 | Kuroda | ............... | 708/320 |
| 6,584,481 B1 * | 6/2003 | Miller | ............... | 708/320 |
| 7,062,521 B2 * | 6/2006 | Yeum | ............... | 708/320 |
| 7,159,002 B2 * | 1/2007 | Gurrapu | ............... | 708/320 |
| 7,289,558 B2 * | 10/2007 | Bose et al. | ............... | 375/233 |
| 2006/0056640 A1 * | 3/2006 | Barnhill | ............... | 381/23 |
| 2010/0146024 A1 * | 6/2010 | Magano | ............... | 708/209 |

\* cited by examiner

*Primary Examiner* — Lewis A Bullock, Jr.
*Assistant Examiner* — Matthew Sandifer
(74) *Attorney, Agent, or Firm* — McGinn Intellectual Property Law Group, PLLC

(57) ABSTRACT

A filter operation circuit of a microprocessor executes an IIR filter operation by using data provided from registers R0 to R2 and outputs one sample of data Y[n] subjected to filter operation and transfer data P[n] to be used in the next IIR filter operation. Register R0 provides filter coefficients to the filter operation circuit. Register R1 provides past transfer data P[n−1] and P[n−2] to the filter operation circuit and is overwritten and updated with new transfer data P[n] output from the filter operation circuit. Register R2 holds multiple samples of data X[n] to X[n+3] to be subjected to filter operation and provides X[n] to the filter operation circuit. An area of register R2 in which X[n] has been held is overwritten and updated with Y[n].

8 Claims, 15 Drawing Sheets

Figure 4

| Line No. | INSTRUCTION | | DISCRIPTION |
|---|---|---|---|
| 1 | @11R_L1 | | COMMENT LINE |
| 2 | MOV | R2,mem1 | LOAD X[n] TO X[n+3] INTO REGISTER R2 |
| 3 | MOV | R9,$00000003h | SET INITIAL VALUE OF THE NUMBER OF ITERATIONS OF LOOP IN REGISTER R9 |
| 4 | @START | | COMMENT LINE (BEGINNING OF LOOP) |
| 5 | 11RSUM | R0,R1,R2 | EXECUTE IIR FILTER OPERATION ON 1 SAMPLE |
| 6 | ROR | 16,R2,R2 | CYCLICALLY SHIFT REGISTER R2 RIGHTWARD BY 16 BITS |
| 7 | LOOP | R9,$@START | IF VALUE IN R9 IS NOT ZERO,SUBTRACT 1 FROM VALUE IN R9,THEN BRANCH TO LINE 4 |
| 8 | MOV | mem2,R2 | STORE Y[n] TO Y[n+3] IN DATA MEMORY |
| 9 | BR | $@11R_L1 | UNCONDITIONALLY BRANCH TO LINE 1 |

Figure 8

| R0 | $b_{11}$ | $b_{12}$ | $a_{11}$ | $a_{12}$ |
|----|----|----|----|----|

| R1 | $b_{21}$ | $b_{22}$ | $a_{21}$ | $a_{22}$ |
|----|----|----|----|----|

| R2 | $b_{31}$ | $b_{32}$ | $a_{31}$ | $a_{32}$ |
|----|----|----|----|----|

| R3 | $b_{41}$ | $b_{42}$ | $a_{41}$ | $a_{42}$ |
|----|----|----|----|----|

| R4 | P1[3] | P1[2] | P1[3] | P1[2] |
|----|----|----|----|----|

| R5 | P2[3] | P2[2] | P2[3] | P2[2] |
|----|----|----|----|----|

| R6 | P3[3] | P3[2] | P3[3] | P3[2] |
|----|----|----|----|----|

| R7 | P4[3] | P4[2] | P4[3] | P4[2] |
|----|----|----|----|----|

| R8 | X[7] | X[6] | X[5] | X[4] |
|----|----|----|----|----|

Figure 9

| Line No. | INSTRUCTION | DISCRIPTION |
|---|---|---|
| 1 | @START | COMMENT LINE (BEGINNING OF LOOP) |
| 2 | 11RSUM R0,R4,R8 | EXECUTE FIRST-STAGE BIQUAD FILTER OPERATION |
| 3 | 11RSUM R1,R5,R8 | EXECUTE SECOND-STAGE BIQUAD FILTER OPERATION |
| 4 | 11RSUM R2,R6,R8 | EXECUTE THIRD-STAGE BIQUAD FILTER OPERATION |
| 5 | 11RSUM R3,R7,R8 | EXECUTE FOURTH-STAGE BIQUAD FILTER OPERATION |
| 6 | ROR 16,R8,R8 | CYCLICALLY SHIFT REGISTER R8 RIGHTWARD BY 16 BITS |
| 7 | LOOP R9,$@START | IF VALUE IN R9 IS NOT ZERO, SUBTRACT 1 FROM VALUE IN R9, THEN BRANCH TO LINE 1 | tion by the IIR filter 8 in FIG. 16 can be
MICROPROCESSOR PERFORMING IIR FILTER OPERATION WITH REGISTERS

BACKGROUND OF THE INVENTION

1. Field of the Invention

The present invention relates to a microprocessor that performs IIR filter operations.

2. Description of Related Art

Microprocessors, such as digital signal processors (DSP), that are designed specifically for digital signal processing are commonly used for infinite impulse response (IIR) filter operations.

Various expression forms of IIR filters have been proposed. Typical forms are direct form I and direct form II. FIG. 15 shows a second-order IIR filter 7 expressed by the direct form I. The second-order IIR filter 7 includes a feed-forward section 72 and a feedback section 71 connected in series in this order. In FIG. 15, reference numerals 711, 712, 721, and 722 denote delay circuits (memory elements) that delay input data by one sample. Reference numerals 713, 714, 723, and 724 denote multipliers. Reference symbols a1, a2, b1 and b2 denote filter coefficients applied to the multipliers 713, 714, 723, and 724. Reference numerals 715 and 725 denote adders that perform arithmetic addition of input data. The term "sample" means digital data that can be obtained in one sampling in a digital data series resulting from digitization by sampling an analog signal at predetermined time intervals.

A filter operation by the IIR filter 7 in FIG. 15 can be expressed by the following equation (1):

$$Y[n] = X[n] + \sum_{k=1}^{2} b_k \cdot X[n-k] + \sum_{k=1}^{2} a_k \cdot Y[n-k] \quad (1)$$

where X[n] is the n-th sample data to be subjected to filter operation and Y[n] is data already subjected to filter operation.

FIG. 16 shows a second-order IIR filter 8 expressed by the direct form II. The direct-form-II second-order IIR filter 8 has a configuration in which the feedback section and feed-forward section of the direct I are flipped. In FIG. 16, reference numerals 811 and 812 denote delay circuits (memory elements) that delay input data by one sample. Reference numerals 813 to 816 denote multipliers. Reference symbols a1, a2, b1 and b2 denote filter coefficients applied to the multipliers 813 to 816. Reference numerals 817 and 818 denote adders that perform arithmetic addition of input data.

A filter operation by the IIR filter 8 in FIG. 16 can be expressed by the following equations (2) and (3):

$$P[n] = X[n] + \sum_{k=1}^{2} a_k \cdot P[n-k] \quad (2)$$

$$Y[n] = P[n] + \sum_{k=1}^{2} b_k \cdot P[n-k] \quad (3)$$

where X[n] is the n-th sample data to be subjected to filter operation, Y[n] is data already subjected to filter operation, and P[n] is intermediate data passed to a new filter operation on data X[n+1] to be subjected to filter operation and subsequent data.

The second-order IIR filters 7 and 8 shown in FIGS. 15 and 16 are called biquad filters. To implement a high-order IIR filter, typically biquad filters are connected in series. For example, an eighth-order IIR filter 9 can be implemented by connecting four direct-form-II biquad filters in series as shown in FIG. 17. In FIG. 17, reference numerals 811, 812, 821, 822, 831, 832, 841, and 842 denote delay circuits (memory elements) that delay input data by one sample. Reference numerals 813 to 816, 823 to 826m 833 to 836, and 843 to 846 denote multipliers.

Reference symbols a11, a12, b11, and b12 denote filter coefficients applied to the multipliers 813 to 816. Similarly, reference symbols a21, a22, b21, and b22 denote filter coefficients applied to the multipliers 823 to 826, reference symbols a31, a32, b31, and b32 denote filter coefficients applied to the multipliers 833 to 836 and reference symbols a41, a42, b41, and b42 denote filter coefficients applied to the multipliers 843 to 846.

Reference numerals 817, 818, 827, 828, 837, 838, 847, and 848 denote adders that perform arithmetic additions of input data and A[n] represents output data from the first-stage biquad filter 91. Similarly, B[n] represents output data from the second-stage biquad filter 92 and C[n] represents output data from the third-stage biquad filter 93.

Generally, a program that causes a DSP to execute IIR filter operations (hereinafter referred to as an IIR filter operation program) is represented by loop processing. For example, loop processing of an IIR filter operation program is written as loop processing in which one loop unit is a set of instructions for executing an IIR filter processing for one sample. As another example, loop processing of an IIR filter operation program is written as loop processing in which one loop unit is a set of instructions for executing basic block processing, where the basic block is a unit of series connection of filters such as biquad filters. The basic block is not limited to a biquad filter (second-order filter). For example, a basic block may be a third-or-higher-order IIR filter.

For example, a sample program for causing a microprocessor to execute arithmetic processing of a fourth-order IIR filter consisting of two direct-form-II biquad filters connected in series is shown in pp. 9-11 of Chapter 4 "Signal Processing" in Non-Patent Document 1.

[Non-Patent Document 1] TMS320C54x DSP Reference Set Volume 4: Applications Guide, [online], October 1996, pp. 4-9-4-11, Texas Instruments Inc., [searched on Jul. 10, 2007], Internet <URL: http://focus.ti.com/lit/ug/sprul73/sprul73.pdf>

An IIR filter operation is repeatedly executed on successively input samples in many cases, such as filtering of audio and video signals obtained by sensors such as microphones and cameras, or communication signals. An IIR filter is a recursive filter containing so-called feedbacks. Therefore, in order to repeatedly execute an IIR filter operation on samples input one after another, data generated by the past filter operation need to be efficiently provided to the next operation as input data.

SUMMARY OF THE INVENTION

The present inventors have found a problem that execution of IIR filter operations by a microprocessor involves, in addition to arithmetic operations that are essential part of the IIR filter operation, many redundant processes such as loading data from a data memory to an accumulator (general register), storing data from the accumulator to the data memory, and moving data from one storage area to another in the data memory, which prevent improvements of the speed of the IIR filter operations.

A first exemplary aspect of the present invention is a microprocessor that executes an IIR filter operation. The microprocessor includes first to third source registers and a filter operation circuit that performs an IIR filter operation by using data provided from the first to third registers and outputs one sample of data subjected to filter operation and transfer data to be used in the next IIR filter operation. The first source register is a register that provides multiple filter coefficients to be used in the IIR filter operation to the filter operation circuit and the second source register is a register that provides the past transfer data to the filter operation circuit and is overwritten with new transfer data output from the filter operation circuit. The third source register is a register that is capable of holding multiple samples of data to be subjected to filter operation and provides the data to be subjected to filter operation to the filter operation circuit. A storage area of the third source register for storing at least one sample is overwritten with the data subjected to filter operation that is output from the filter operation circuit.

As has been described above, the second source register is a source of transfer data to be passed to the filter operation circuit and also a target overwritten with new transfer data output from the filter operation circuit. That is, the second source register functions as both of the target of transfer data output from the filter operation circuit and the source of transfer data to be passed to the filter operation circuit. This eliminates the need for the redundant data movement process for inputting transfer data output from the filter operation circuit into the filter operation circuit anew.

Furthermore, the third source register is capable of holding multiple samples of data to be subjected to filter operation and functions as the source from which data to be subjected to filter operation is input into the filter operation circuit and the target to which data subjected to filter operation is output from the filter operation circuit. Accordingly, the number of accesses to the data memory required for retrieving data to be subjected to filter operation from the data memory and for storing data subjected to filter operation in the data memory can be reduced. Also, the number or size of accumulators required for executing IIR filter operations can be reduced.

By using the second and third source registers as sources and targets from which data is input into and to which data is output from the filter operation circuit, the number of executions of redundant data movement instructions and data memory access instructions can be reduced. That is, the microprocessor according to the first aspect is capable of performing repetitions of basic block processing of IIR filter operations in a simple manner by data input and output between the first to third source registers and the filter operation circuit. Accordingly, the microprocessor according to the first aspect is capable of executing IIR filter operations fast.

According to the exemplary aspect of the present invention, a microprocessor capable of executing IIR filter operations fast can be provided.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 4 shows a portion of a program for executing an IIR filter operation according to the exemplary embodiment of the present invention;

FIG. 8 is a diagram showing initial values of the IIR filter operation held in general registers in the exemplary embodiment of the present invention;

FIG. 9 shows a portion of a program for executing an IIR filter operation according to the exemplary embodiment of the present invention;

DETAILED DESCRIPTION OF THE EXEMPLARY EMBODIMENTS

Figure 1:
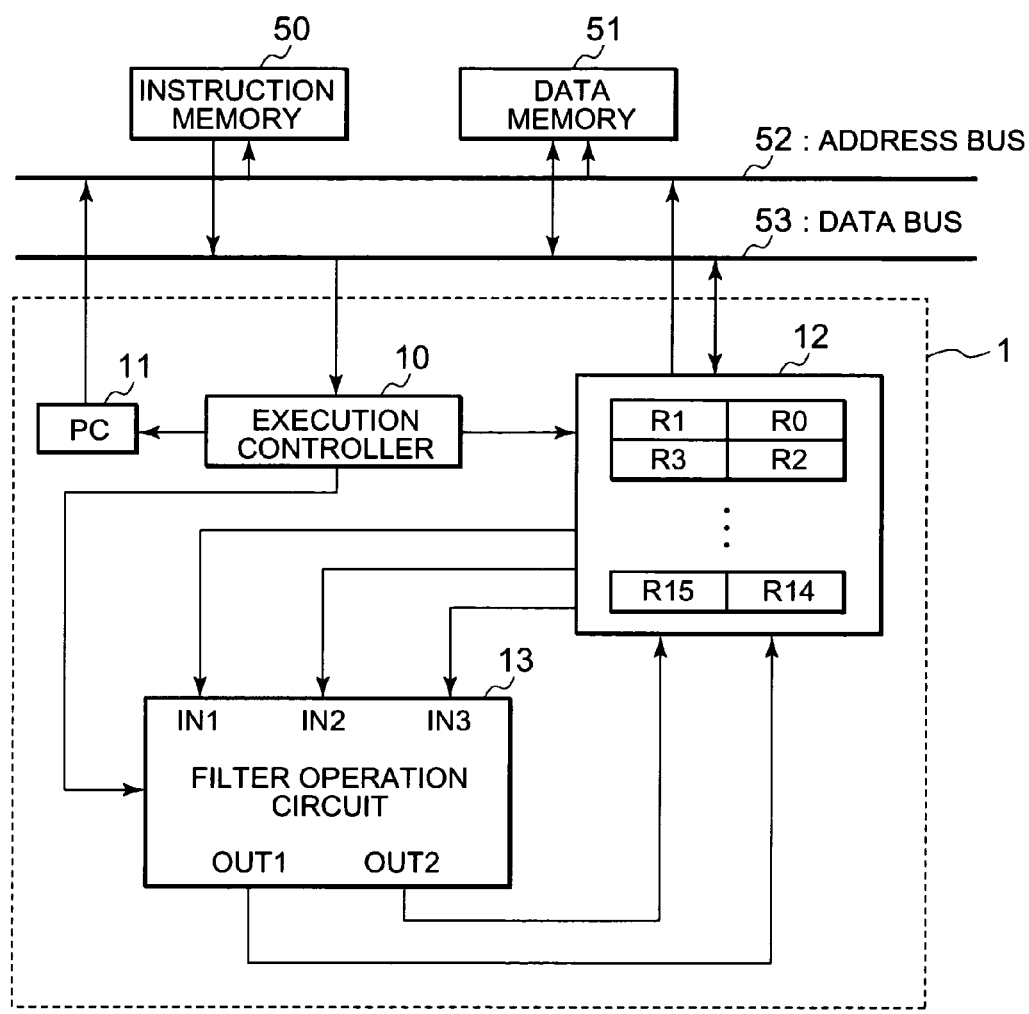
FIG. 1 is a diagram showing a configuration of a microprocessor according to an exemplary embodiment of the present invention.

FIG. 1 shows a microprocessor 1 according to an exemplary embodiment of the present invention. The microprocessor 1 is connected to an instruction memory 50 and a data memory 51 through an address bus 52 and a data bus 53. The instruction memory 50 stores instruction sequences to be executed by the microprocessor 1. The data memory 51 stores data to be input into the microprocessor 1 and data processed by the microprocessor 1. While the instruction memory 50 and the data memory 51 shown in FIG. 1 are logical constitutional units, each of these is configured by a ROM (Read Only Memory), a RAM (Random Access Memory), or a flash memory, or a combination of these.

An execution controller 10 fetches an instruction from the instruction memory 50 and decodes the fetched instruction. In particular, the execution controller 10 determines the type of the fetched instruction, obtains instruction operands, and outputs data or a control signal or both to a program counter (PC) 11, a general register file 12, or a filter operation circuit 13, which will be described later, depending on the information obtained by decoding the instructions.

The program counter 11 is a register that holds the address of an instruction to be fetched by the execution controller 10. The value in the program counter 11 is updated by the execution controller 10.

The general register file 12 is a set of general registers. In the description of the present embodiment, it is assumed that the general register file 12 has 16 general registers R0 to R15 as shown in FIG. 1. Each of the general registers R0 to R15 is a 64-bit register. Of course, the number and length of the general registers R0 to R15 here are illustrative only. The general registers R0 to R15 are registers that can be used in various applications, such as accumulators for storing data input into and output from the filter operation circuit, or address registers for addressing for memory access. In the following description, the low-order 16 bits including the least significant bit (LSB) of 64-bit data held in the general registers R0 to R15 are referred to as the "least significant 16 bits"; the high-order 16 bits including the most significant bit (MSB) of the 64-bit data held in the general registers R0 to R15 are referred to as the "most significant 16 bits".

The filter operation circuit 13 executes an IIR filter operation in response to the execution controller 10 decoding an IIR filter operation instruction. The filter operation circuit 13 uses data provided from three of the general registers R0 to R15 to execute the IIR filter operation and outputs one sample of data subjected to filter operation and transfer data to be used in the next IIR filter operation.

The three registers that provide data to the filter operation circuit 13 hold a set of filter coefficients, transfer data from the past filter operation, and data to be subjected to filter operation. Data output from the filter operation circuit 13 is provided to two of the three general registers that provided data. In particular, one sample of data subjected to filter operation overwrites the register in which the data to be subjected to filter operation was held. On the other hand, transfer data output form the filter operation circuit 13 overwrites the register in which transfer data from the past filter operation is held. The three registers from which data is input into the filter operation circuit 13 and to which data is output from the filter operation circuit 13 are determined by the execution controller 10 on the basis of the operands of an IIR filer operation instruction.

First Exemplary Embodiment

Figure 2:
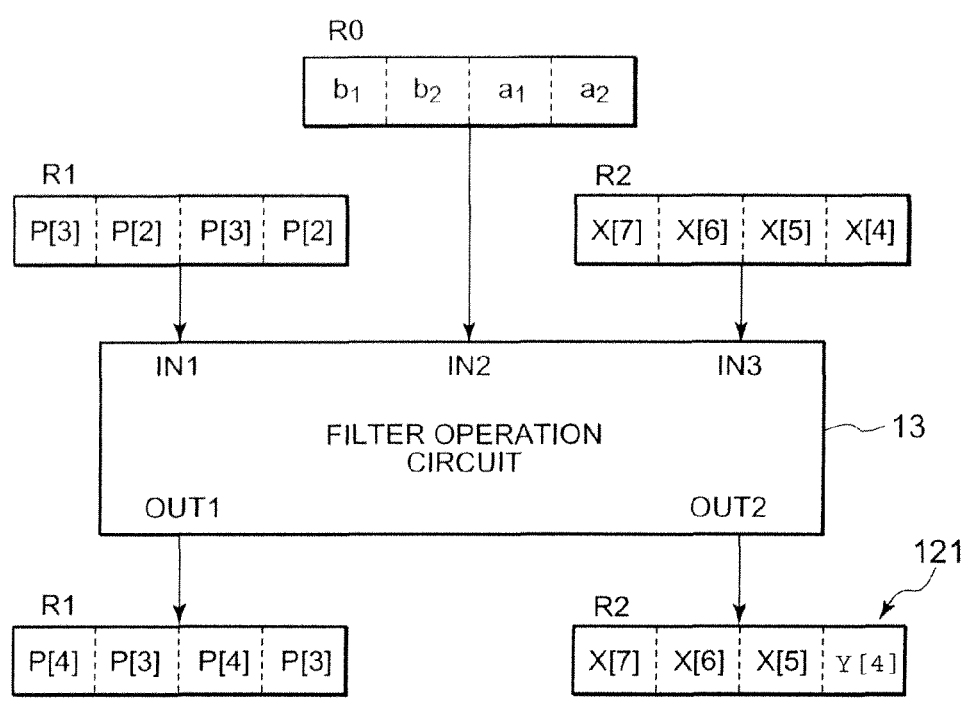
FIG. 2 is a conceptual diagram showing data input into and output from a filter operation circuit according to the exemplary embodiment of the present invention.
Figure 16:
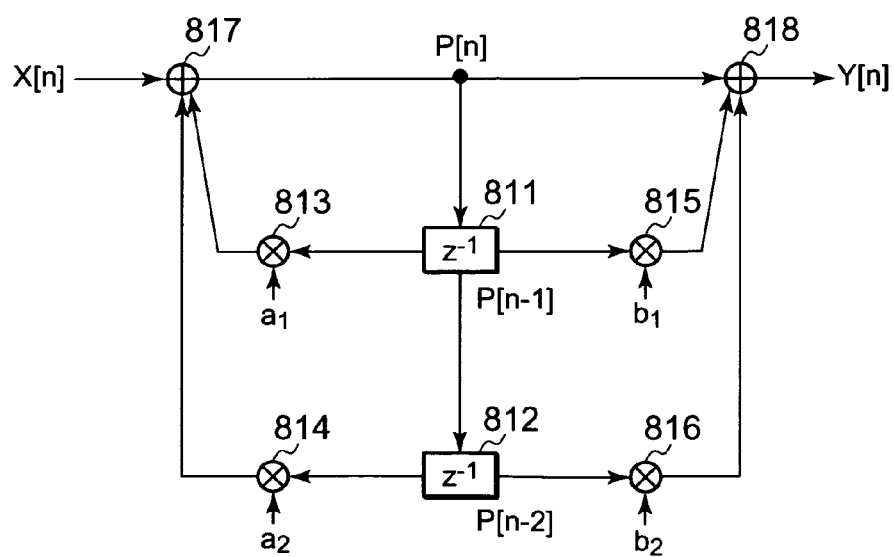
FIG. 16 is a diagram showing a direct-form-II second-order filter of a related art.

FIG. 2 shows an example of input and output data in arithmetic processing of the direct-form-II second-order IIR filter 8 shown in FIG. 16 performed by the filter operation circuit 13. Shown in FIG. 2 are input and output data, where the data lengths of all of data X[n] to be subjected to filter operation, data Y[n] subjected to filter operation, intermediate data (transfer data) P[n], and filter coefficients a1, a2, b1, and b2 in the second-order IIR filter 8 are 16 bits, where n=4.

In FIG. 2, a first general register that provides the filter coefficients a1, a2, b1, and b2 to the filter operation circuit 13 is register R0. Register R0, 64-bit long, according to the embodiment, stores the four filter coefficients, a1, a2, b1, and b2. If the total data amount of filter coefficients to be provided is so large compared with the register length that one general register cannot store all filter coefficients, they may be stored separately in multiple general registers.

In FIG. 2, a second general register that provides intermediate data P[n−1] and P[n−2], which are transfer data in the direct-form-II IIR register 8, to the filter operation circuit 13 is register R1. Register R1 contains intermediate data P[3] and P[2] which are the two preceding samples required in the second-order filter. Two sets of intermediate data P[3] and P[2] are stored in register R1 for convenience of calculation.

In FIG. 2, a third general register that provides data to be subjected to filter operation to the filter operation circuit 13 is register R2. Register R2 contains four pieces of data to be subjected to filter operation in total, in which X[4] is the least significant 16 bits. Here, X[4] to X[7] have been read from the data memory 51 and stored in register R2 prior to execution of the IIR filter operation.

Figure 3:
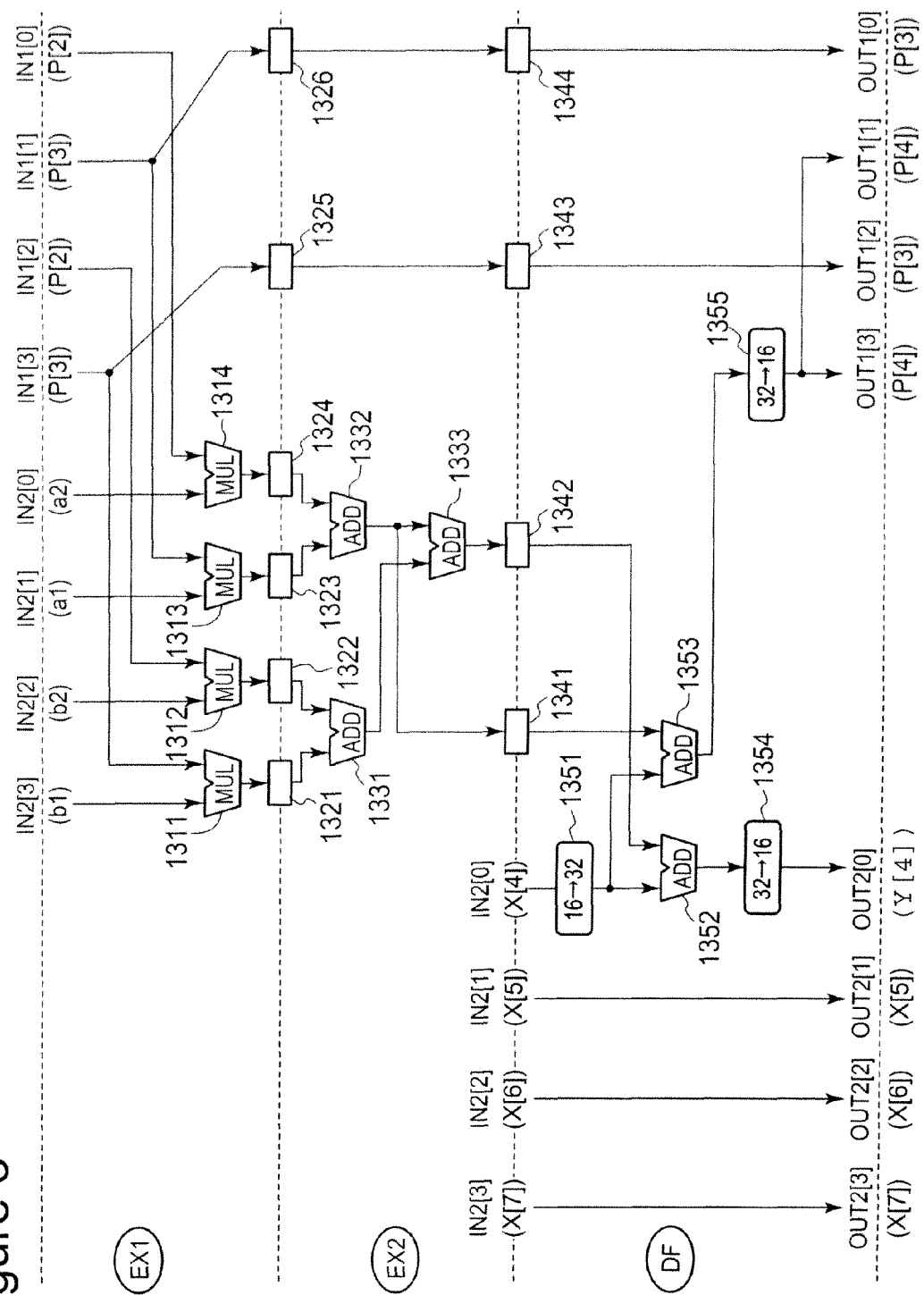
FIG. 3 is a diagram showing an exemplary configuration of a filter operation circuit according to the exemplary embodiment of the present invention.

The results of the IIR filter operation performed by the filter operation circuit 13 using the data held in registers R0 to R2 described above as input data are output to registers R1 and R2. In particular, register R1 is overwritten with the intermediate data P[4] and P[3]. Also, the least significant 16 bits (overwrite area 121) of register R2 in which data X[4] to be subjected to filter operation was stored are overwritten with the data Y[4] subjected to filter operation. An exemplary configuration of the filter operation circuit 13 that performs arithmetic processing of the direct-form-II second-order IIR filter 8 will be described below. FIG. 3 is a block diagram showing an exemplary configuration of the filter operation circuit 13 shown in FIG. 2. The exemplary configuration shown in FIG. 3 uses a pipeline architecture and performs an operation of the second-order IIR filter for one sample data in a three-stage pipeline. The configuration of the filter operation circuit 13 shown in FIG. 3 is illustrative only, of course. Various variations will be apparent to those skilled in the art from FIG. 3 and the following description and the common technical knowledge.

In FIG. 3, a multiplier 1311 multiplies intermediate data P[3] provided to terminal IN1 by filter coefficient b1 provided to terminal IN2. An output from the multiplier 1311 is held in a pipeline latch 1321. That is, the multiplier 1311 is equivalent to the multiplier 815 in FIG. 16. Similarly, the other multipliers 1312 to 1314 in the first stage are equivalent to the multipliers 816, 813, and 814 in FIG. 16, respectively. The results of multiplications by the multipliers 1312 to 1314 are held in pipeline latches 1322 to 1324. Pipeline latches 1325 and 1326 latch intermediate data P[3].

Then, in the second stage in FIG. 3, an adder 1331 adds data input from the pipeline latches 1321 and 1322 together. That is, the result of the addition by the adder 1331 corresponds to the second term of the right-hand side of Equation (3) given above. An adder 1332 adds data input from the pipeline latches 1323 and 1324 together. That is, the result of the addition by the adder 1332 corresponds to the second term of the right-hand side of Equation (2) given above. An adder 1333 adds the outputs from the two adders 1331 and 1332 together. Pipeline latches 1341 to 1344 latch the outputs from the adders 1332 and 1333 and the outputs from the pipeline latches 1325 and 1326.

A converter 1351 then converts the data length of the data X[4] to be subjected to filter operation provided to terminal IN2 from 16 bits to 32 bits in the third stage in FIG. 3. The conversion is performed for allowing each numerical value to be treated as a 32-bit fixed-point number in the filter operation circuit 13.

An adder 1352 adds the X[4] converted to 32-bit data and the data held in pipeline latch 1342 together. The output from the adder 1352 is converted to 16-bit length by a converter 1354, and then output as data Y[4] subjected to filter operation. As described above, Y[4] is stored in the storage area which contained X[4], in particular, in the least significant 16 bits of register R2.

An adder 1353 adds X[4] converted to 32-bit data to the data held in the pipeline latch 1342. The output from the adder 1353 is converted by a converter 1355 to 16-bit data, and then output to terminal OUT1 as intermediate data P[4]. As described above, P[4] overwrites the storage area which contained P[3] of register R1.

A sample program for causing the microprocessor 1 including the filter operation circuit 13 shown in FIG. 2 to repeatedly execute a second-order IIR filter operation will be described below. FIG. 4 shows a main part of the program related to repetitive execution of the second-order IIR filter operation. For convenience of explanation, instructions such as an instruction for incrementing the address (mem1) of a location from which data X[n] to be subjected to filter operation is read and the address (mem2) of a location in which data Y[n] subjected to filter operation is stored are omitted from FIG. 4.

The first line in FIG. 4 is merely a comment line. The MOV instruction on the second line in FIG. 4 is a data transfer instruction, in which the first operand indicates the location to which the data is to be transferred and the second operands indicates the location from which the data is to be transferred. That is, the second line in FIG. 4 is an instruction to load four pieces of data X[n] to X[n+3] to be subjected to filter operation from the data memory 51 into register R2.

The MOV instruction on the third line in FIG. 4 represents processing for setting an immediate value specified by the second operand in register R9 specified by the first operand. Here, the value set in register R9 is the initial value indicating the number of iterations of the subsequent loop processing. In the example in FIG. 4, "3h" is set in register R9 for performing four iterations of the loop.

The fourth line in FIG. 4 is a comment line indicating the beginning of the loop processing. The fifth to ninth lines in FIG. 4 represent loop processing for executing the IIR filter operation.

The IIRSUM instruction on the fifth line in FIG. 4 instructs to execute the IIR filter operation by the filter operation circuit 13. In particular, as the first operand of the IIRSUM instruction, a first general register that provides filter coefficients a1, a2, b1, and b2 to the filter operation circuit 13 is specified. As the second operand of the IIRSUM instruction, a second general register that provides intermediate data P[n−1] and P[n−2] to the filter operation circuit 13 is specified. As the third operand of the IIRSUM instruction, a third general register that provides data X[n] to be subjected to filter operation circuit 13 is specified. For correspondence to FIG. 2, the first general register is referred to as register R0, the second general register as register R1 and the third general register as register R2 in FIG. 4.

As described above, new intermediate data P[n] and [n−1] obtained as a result of the execution of the IIRSUM instruction overwrite register R1. The data Y[n] subjected to filter operation overwrites the area 121 of register R2 where X[n] was stored (to be more specific, the least significant 16 bits of register R2).

The ROR instruction on the sixth line in FIG. 4 instructs to perform rightward cyclic shifting. In particular, the value in register R2 specified by the second operand of the ROR instruction is cyclically shifted rightward by the number of bits (16 bits in FIG. 4) specified by the first operand. As a result, Y[n] obtained through the filter operation based on the IIRSUM instruction on the fifth line is shifted into the most significant 16 bits of register R2 and X[n+1] appears in the least significant 16 bits of register R2.

The LOOP instruction on the seventh line in FIG. 4 instructs to make determination as to whether the loop processing should be ended. In particular, when the value in register R9 specified by the first operand of the LOOP instruction is not zero, 1 is subtracted from the value in R9 and a branch is caused to a position (the fourth line) represented by an immediate value specified as the second operand. Since the initial value in register R9 in the example shown in FIG. 4 is "3", the operation on the fifth and sixth lines are repeated four times. After four iterations of the loop processing has been executed, four pieces of data Y[n] to Y[n+3] subjected to filter operation are contained in register R2.

The MOV instruction on the eighth line in FIG. 4 instructs to store the four pieces of data Y[n] to Y[n+3] subjected to filter operation from register R2 into the data memory 51. Finally, the BR instruction on the ninth line in FIG. 4 instructs to cause an unconditional branch to the position (the first line) specified by the first operand.

Figure 5:
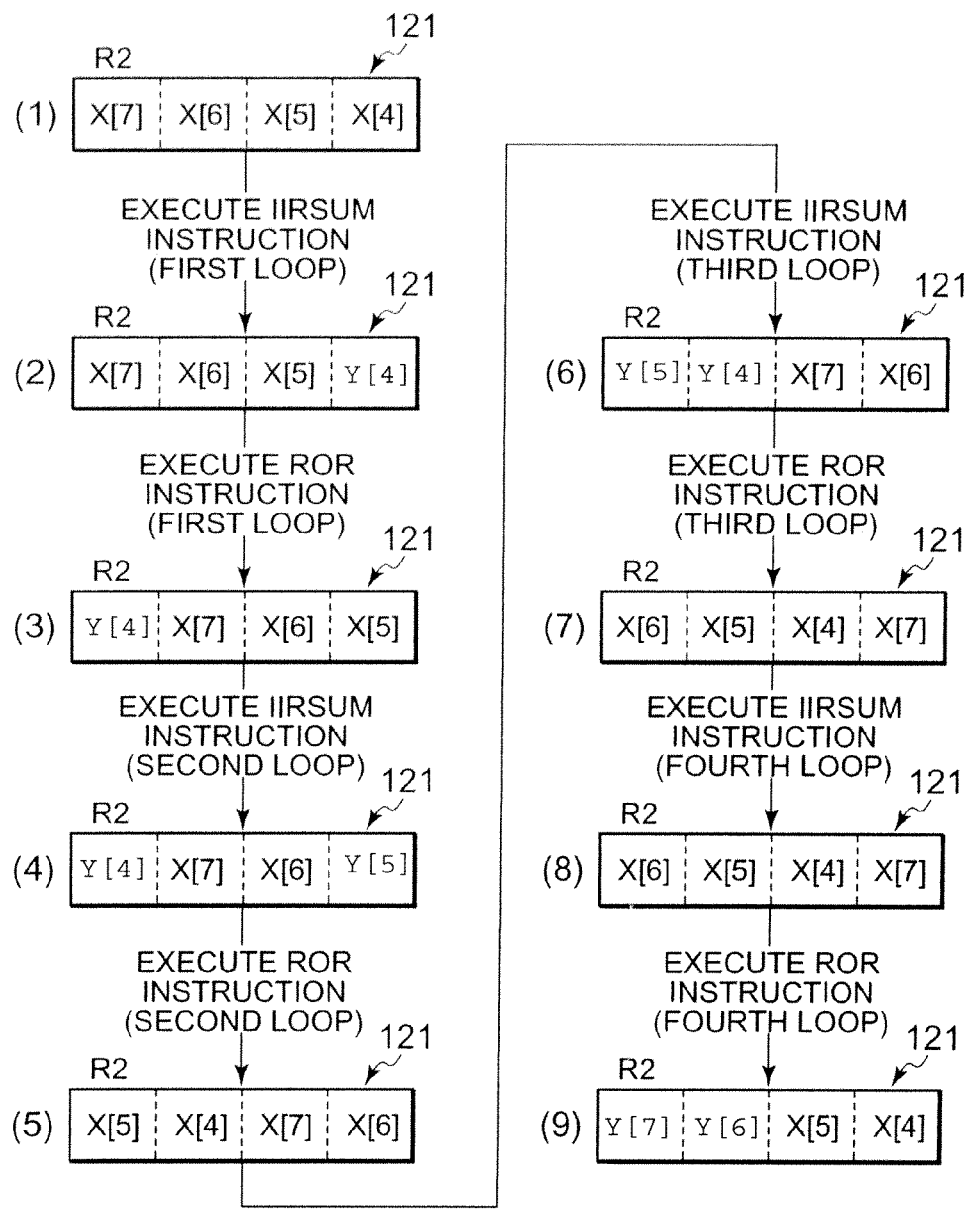
FIG. 5 is a diagram showing changes in values stored in registers in the process of execution of an IIR filter operation according to the exemplary embodiment of the present invention.

FIG. 5 is a conceptual diagram showing changes in values in register R2 in the progress of the execution of the program shown in FIG. 4. In FIG. 5, n=4. FIG. 5(1) shows the state of register R2 before the first iteration of the loop processing is started. Register R2 contains X[4] to X[7] loaded from the data memory 51.

FIG. 5(2) shows the state of register R2 after the IIRSUM instruction is executed in the first iteration of the loop processing. The least significant 16 bits (overwrite area 121) where X[4] was stored have been overwritten by Y[4].

FIG. 5(3) shows the state of register R2 after the rightward cyclic shift according to the ROR instruction in the first iteration of the loop has been executed. In particular, Y[4] that was in the least significant 16 bits has been shifted to the most significant bits and X[5], which is data to be input in the next IIR filter operation, is in the least significant 16 bits.

FIG. 5(4) shows the state of register R2 after the IIRSUM instruction in the second iteration of the loop has been executed. In particular, as a result of X[5] being provided from register R2 to the filter operation circuit 13 and the IIR filter operation being executed, Y[5] is stored in the least significant 16 bits of register 2.

FIG. 5(5) shows the state of register R2 after the rightward cyclic shift according to the ROR instruction in the second iteration of the loop processing has been executed. In particular, Y[5] that was in the least significant 16 bits has been shifted to the most significant bits and X[6], which is data to be input in the next IIR filter operation, is in the least significant 16 bits.

Similarly, FIGS. 5(6) to 5(9) show the results of execution of the IIRSUM instructions or the ROR instructions in the third and fourth loops.

In this way, according to the program in FIG. 4, multiple pieces of data X[4] to X[7] to be subjected to filter operation are read at once before the IIR filter operation instruction (IIRSUM instruction) and the cyclic shift instruction (ROR instruction) are repeatedly executed. Consequently, the number of accesses to the data memory required for retrieving data X[n] to be subjected to filter operation from the data memory 51 and for storing data Y[n] subjected to filter operation in the data memory 51 can be reduced.

Furthermore, in the present exemplary embodiment, intermediate data P[n] is provided from the second general register (register R1 in FIG. 2) to the filter operation circuit 13 and the second register is updated with intermediate data P[n+1] output from the filter operation circuit 13 one after another. This eliminates the need for redundant data movement processing for inputting intermediate data output from the filter operation circuit 13 into the filter operation circuit 13 anew.

In short, the microprocessor 1 according to the present exemplary embodiment is capable of executing an IIR filter operation fast because the microprocessor 1 can straightforwardly perform repetitions of basic block processing in the IIR filter operation by inputting and outputting data between the first to third general registers (registers R0 to R2) and the filter operation circuit 13.

It will be understood that the sample program shown in FIG. 4 is merely illustrative and various variations, such as unrolling the loop processing, can occur to those skilled in the art.

Second Exemplary Embodiment

Figure 15:
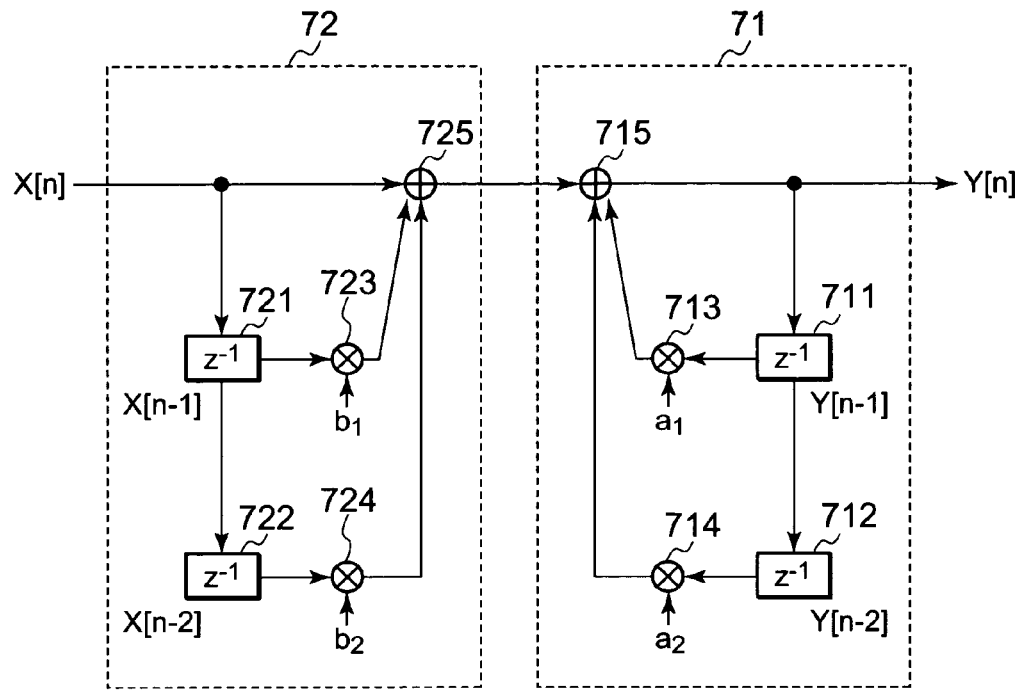
FIG. 15 is a diagram showing a direct-form-I second-order IIR filter of a related art.

An exemplary embodiment will be described in which the arithmetic processing of the direct-form-I second-order IIR filter 7 shown in FIG. 15 is executed by a filter operation circuit 13. In the direct form II described above, intermediate data P[n] expressed by Equation (2) is stored in the second general register as transfer data. In the direct form I in the present exemplary embodiment, X[n−1], X[n], Y[n−1], and Y[n] required for a filter operation on the next sample X[n+1] is preferably stored in the second general register as transfer data, as can be seen from Equation (1).

Figure 6:
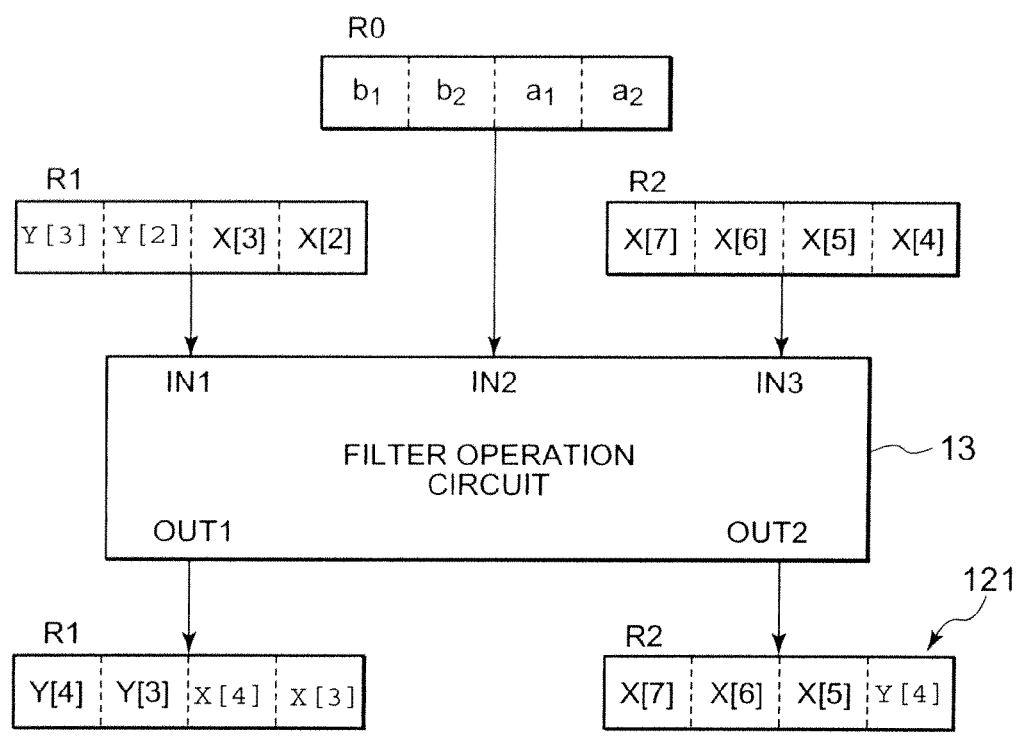
FIG. 6 is a conceptual diagram showing data input into and output from a filter operation circuit according to the exemplary embodiment of the present invention.

In FIG. 6, data X[n] to be subjected to filter operation, data Y[n] subjected to filter operation, transfer data, and filter coefficients a1, a2, b1, and b2 in the second-order IIR filter 7 all have a data length of 16 bits. FIG. 6 shows input and output data, where n=4. The configuration shown in FIG. 6 differs from the direct form II shown in FIG. 2 in transfer data held in register R1.

Figure 7:
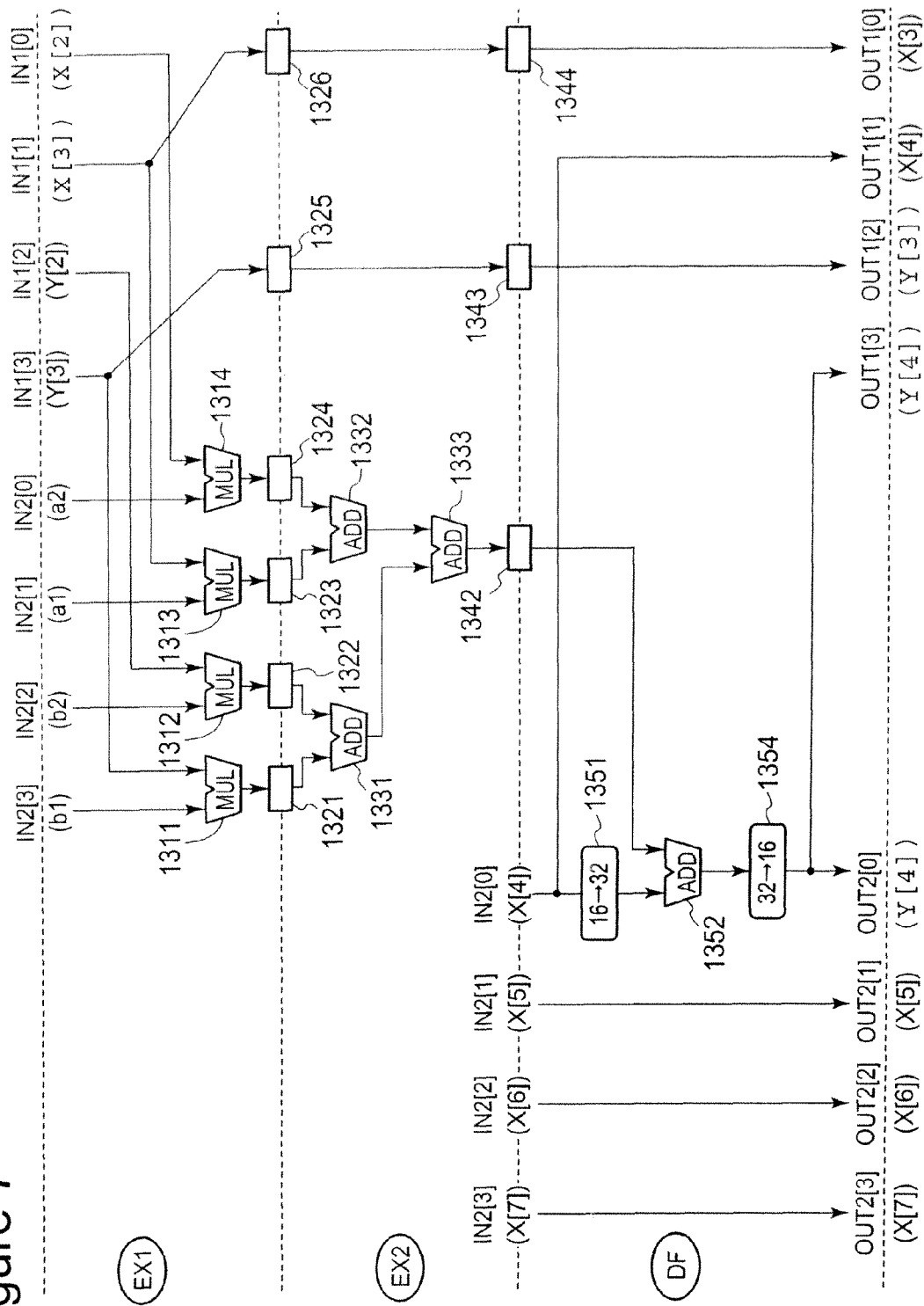
FIG. 7 is a diagram showing a configuration of a filter operation circuit according to the exemplary embodiment of the present invention.
Figure 10:
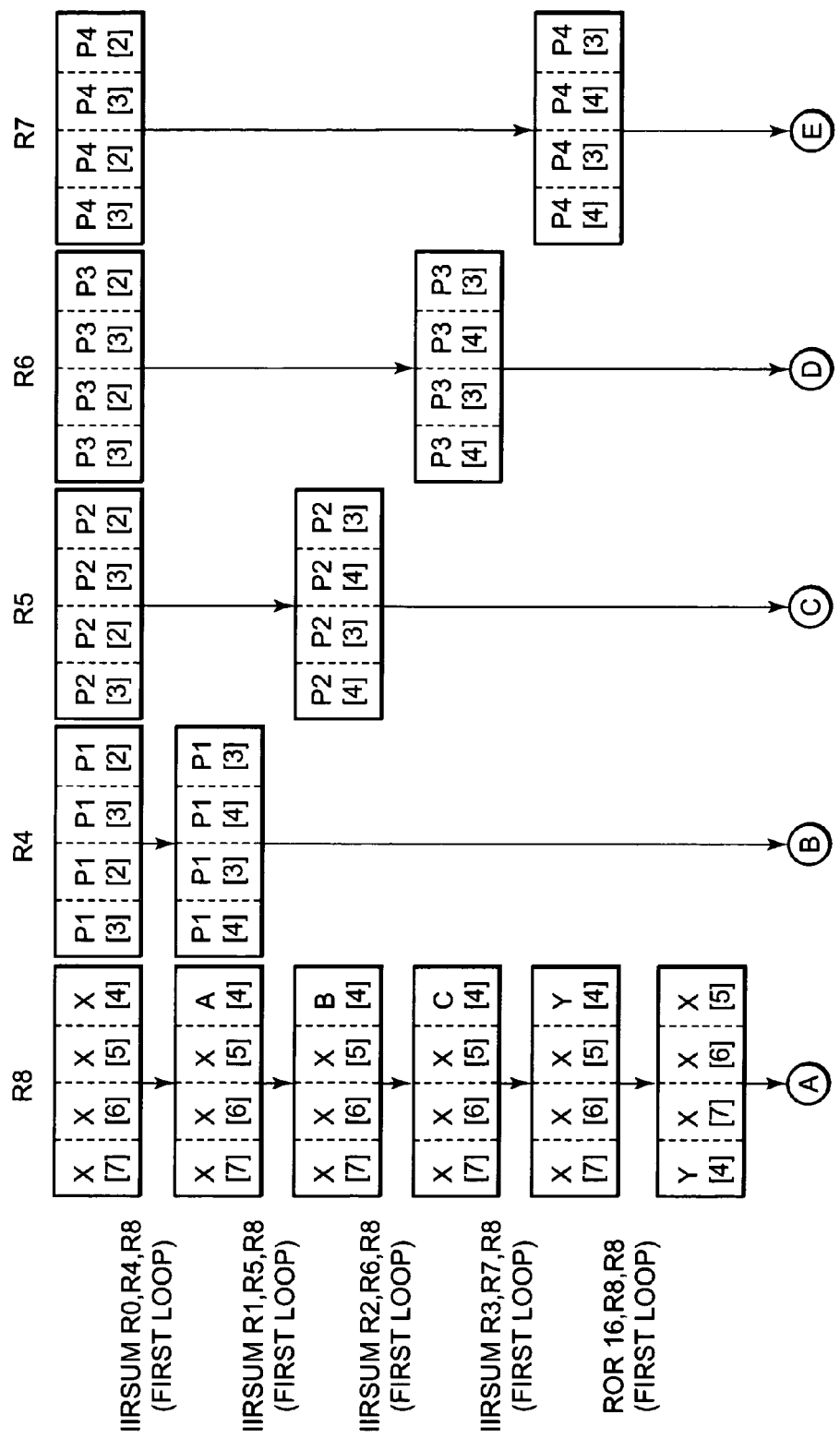
FIG. 10 is a diagram showing changes in values stored in registers in the process of execution of an IIR filter operation according to the exemplary embodiment of the present invention.
Figure 11:
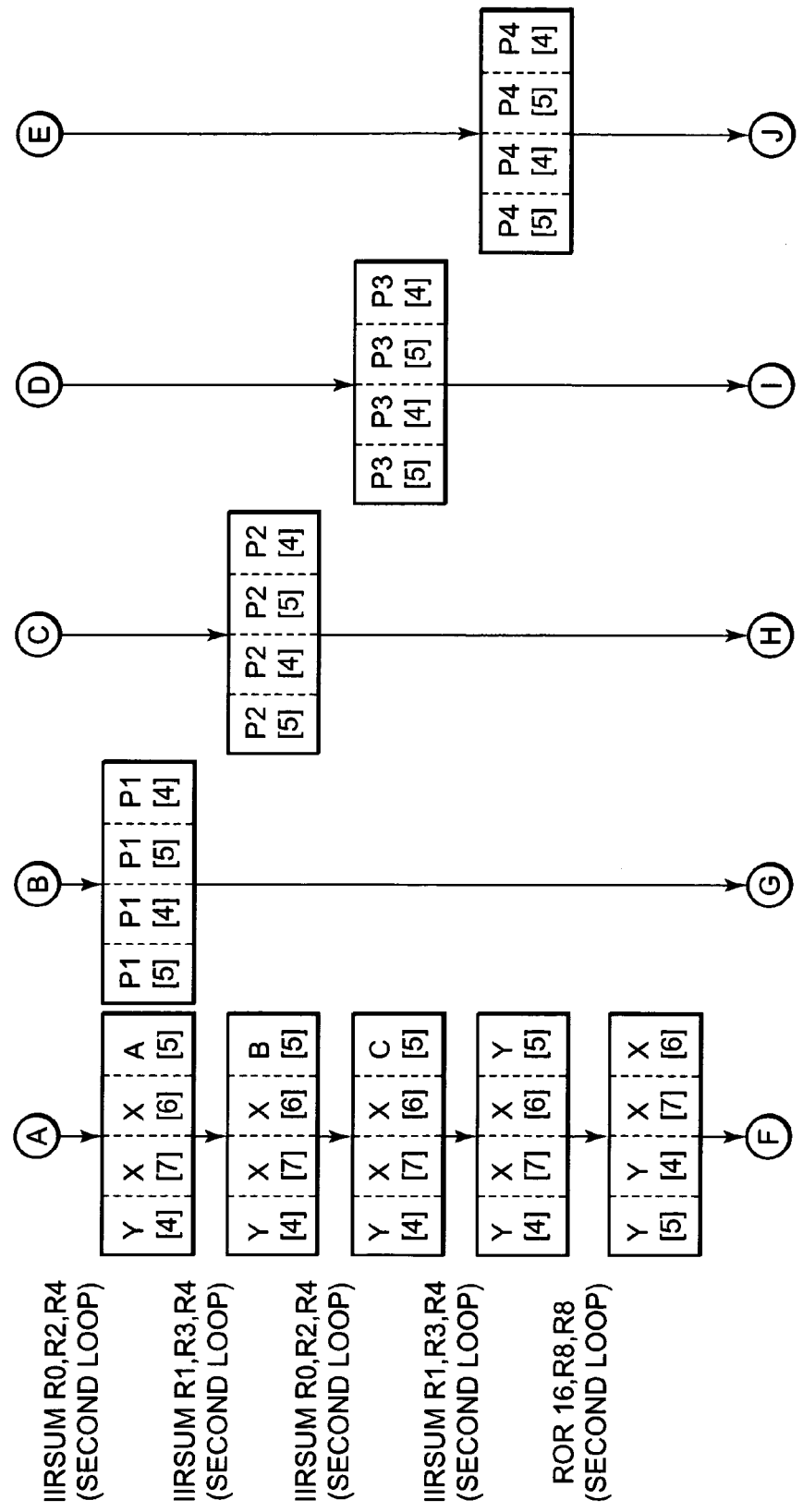
FIG. 11 is a diagram showing changes in values stored in registers in the process of execution of an IIR filter operation according to the exemplary embodiment of the present invention.
Figure 12:
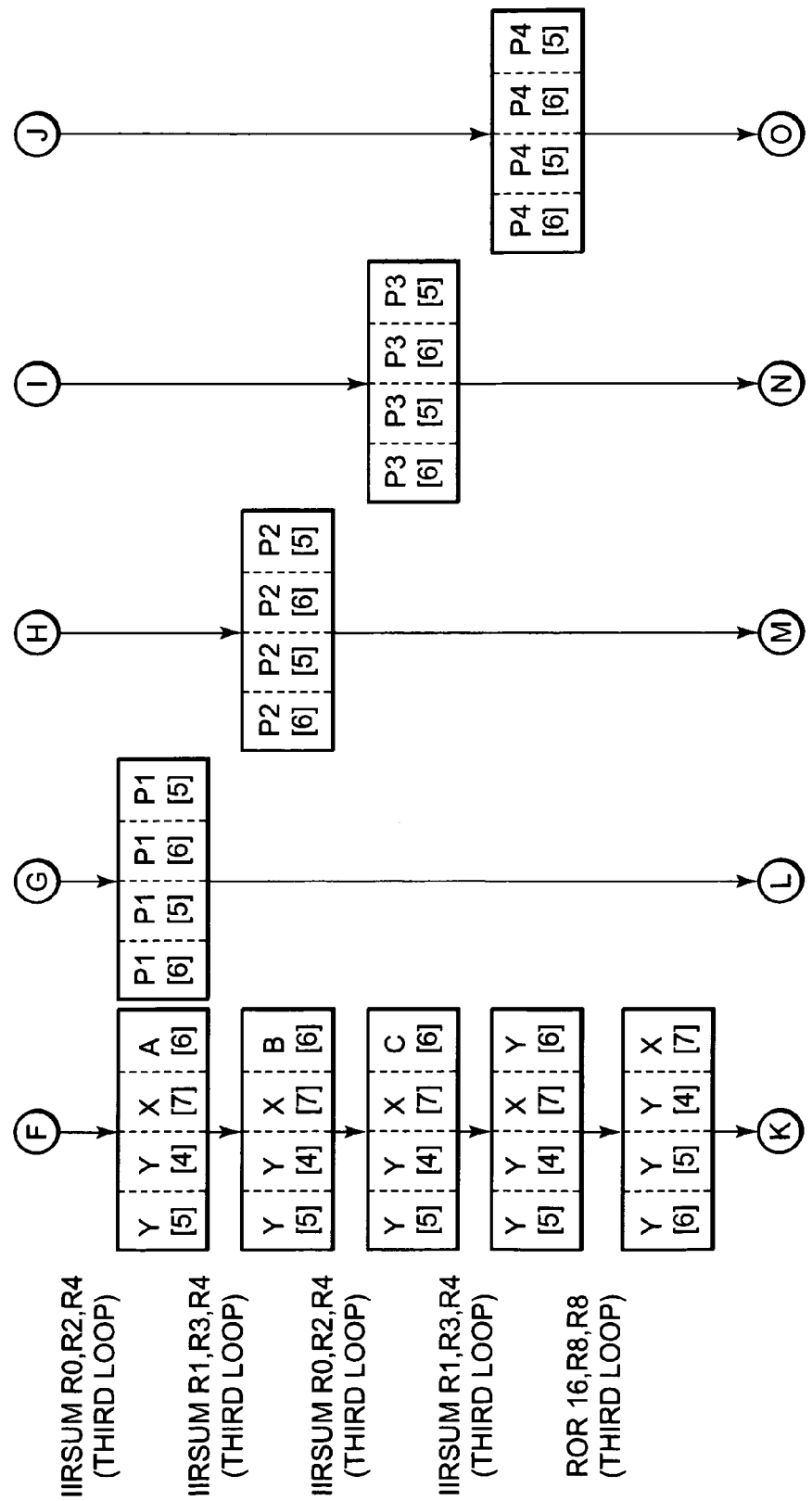
FIG. 12 is a diagram showing changes in values stored in registers in the process of execution of an IIR filter operation according to the exemplary embodiment of the present invention.
Figure 13:
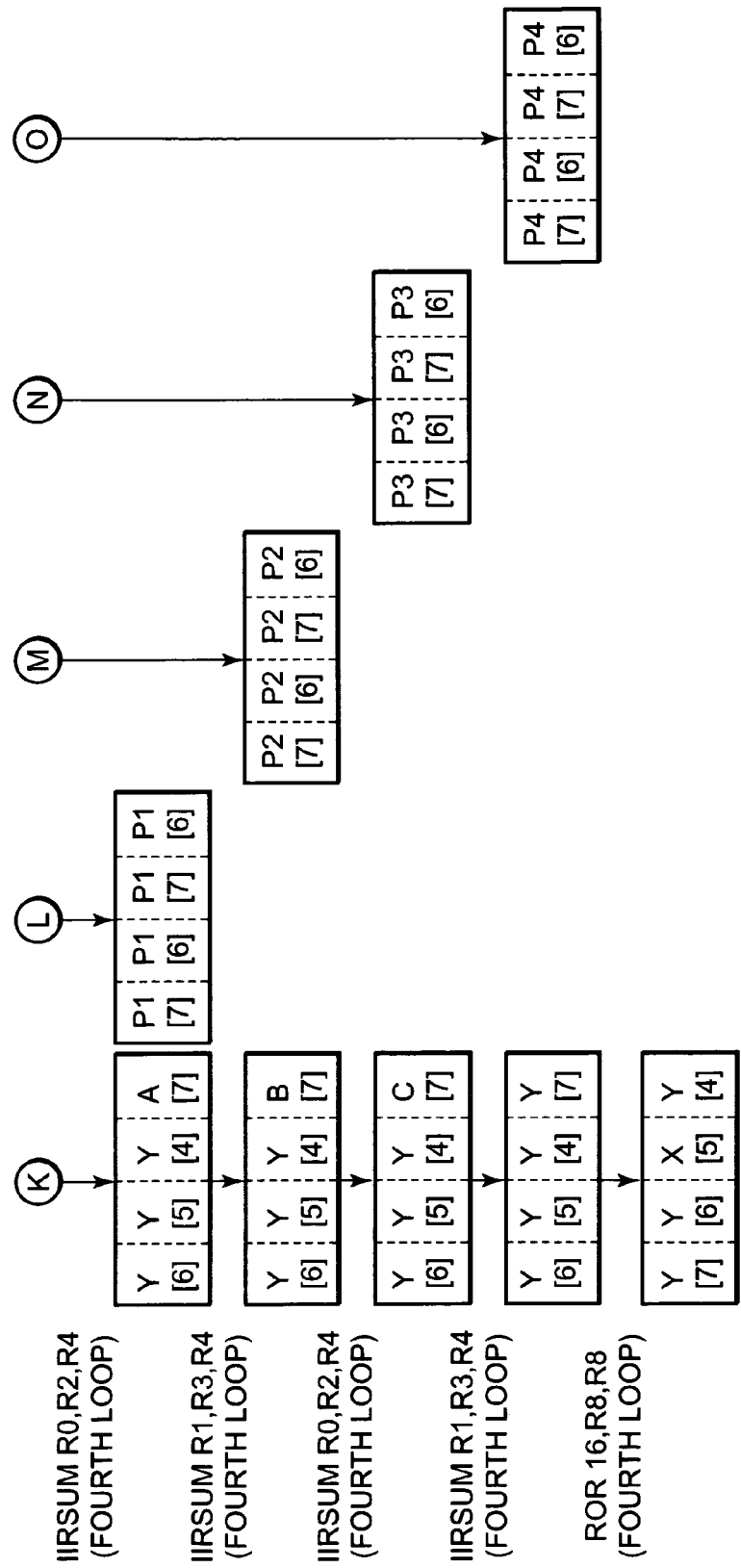
FIG. 13 is a diagram showing changes in values stored in registers in the process of execution of an IIR filter operation according to the exemplary embodiment of the present invention.

FIG. 7 is a block diagram showing a specific exemplary configuration of a filter operation circuit 13 that performs operations of direct-form-I second-order IIR filter 7. Comparing the configuration in FIG. 7 with the configuration for the direct form II shown in FIG. 3, multipliers 1311 to 1314 and adders 1331 to 1334 included in first and second pipeline stages are the same as those in the configuration in FIG. 3. However, the configuration in FIG. 7 differs from the configuration in FIG. 3 in transfer data input in terminal IN1. Focusing on the third pipeline stage, pipeline latch 1341, adder 1353, and converter 1355 are omitted from the configuration in FIG. 7 because calculation of intermediate data P[n] is not performed.

As described above, the configuration according to the present exemplary embodiment for direct-form-I IIR filter 7 differs from the configuration according to the first exemplary embodiment for the direct-form-II IIR filter 8 only in the transfer data stored in the second general register (register R1). Accordingly, the microprocessor 1 having the specific configuration according to the present exemplary embodiment, like the microprocessor shown in the first exemplary embodiment, is capable of straightforwardly performing the repetitive basic block processing of an IIR filter operation by inputting and outputting data between the first to third general registers (registers R0 to R2) and the filer operation circuit 13 and therefore is capable of executing IIR filter operations fast.

Third Exemplary Embodiment

In the present exemplary embodiment, the description will be made of the case in which arithmetic processing of an eighth-order IIR filter 9 in FIG. 17 made up of biquad filters 91 to 94 connected in series is performed by a filter operation circuit 13. In order for the single filter operation circuit 13 to perform operations corresponding to the four biquad filters 91 to 94 connected in series, filter coefficients, transfer data (intermediate data), and data to be subjected to filter operations need to be selectively provided to the filter operation circuit 13. This can be accomplished by changing the first to third general registers specified as the operands of a filter operation instruction (IIRSUM instruction).

FIG. 8 shows the initial values held in general registers R0 to R8, where the sample number n=4. In FIG. 8, register R0 holds filer coefficients a11, a12, b11, and b12 for biquad filter 91. Similarly, registers R1 to R3 hold the filter coefficients for biquad filters 92 to 94. Register R4 holds intermediate data P1[3] and P1[2] related to biquad filter 91. Similarly, registers R5 to R7 hold intermediate data related to biquad filters 92 to 94. Finally, register R8 holds data X[4] to X[7] to be subjected to filter operation.

A sample program will now be shown that causes a microprocessor 1 to repeatedly execute a filter operation of the eighth-order IIR filter 9. FIG. 9 shows a loop processing portion extracted from a program related to repetitive execution of a filter operation by the eighth-order IIR filter 9. The program in FIG. 9 corresponds to the loop processing from the fourth to seventh lines of the program shown in FIG. 4.

The first line in FIG. 9 is a comment line representing the beginning of the loop and the second to seventh lines in FIG. 9 show the loop processing that executes the IIR filter operation.

Figure 17:
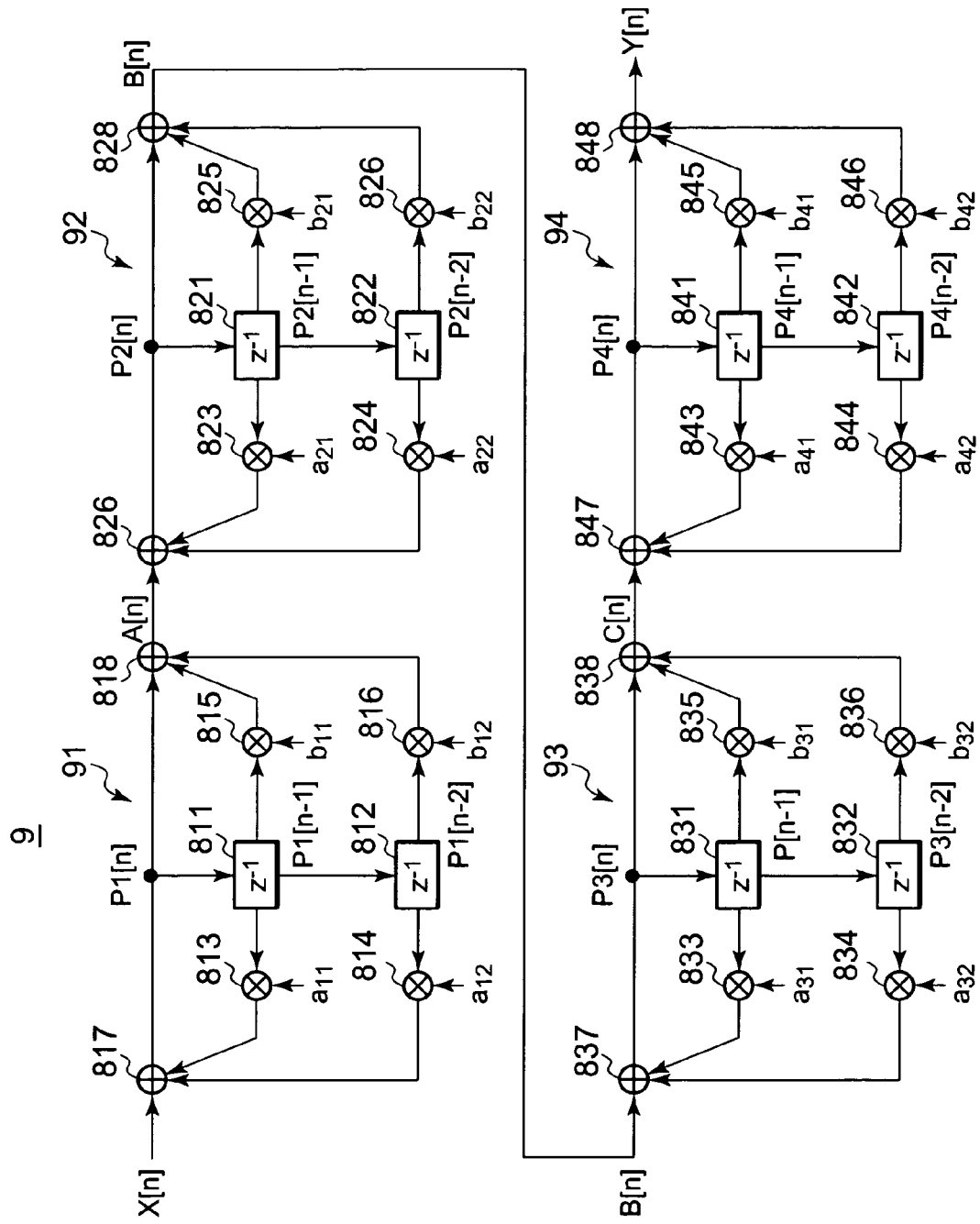
FIG. 17 is a high-order IIR filter consisting of direct-form-II biquad filters connected in series of a related art.

The IIRSUM instruction on the second line of FIG. 9 instructs to execute a filter operation by the first-stage biquad filter 91 in FIG. 17. In particular, registers R0, R4, and R8 are specified as the operands of the IIRSUM instruction on the second line in FIG. 9. As a result of the execution of the IIRSUM instruction, X[4] stored in the least significant 16 bits of register R8 is overwritten with data A[4] subjected to filter operation.

The IIRSUM instruction on the third line in FIG. 9 instructs to execute a filter operation by the second-stage biquad filter 92. In particular, registers R1, R5, and R8 are specified as the operands of the IIRSUM instruction on the third line in FIG. 9. As a result of the execution of the IIRSUM instruction, A[4] stored in the least significant 16 bits of register R8 is overwritten with data B[4] subjected to filter operation.

The IIRSUM instruction on the fourth line in FIG. 9 instructs to execute a filter operation by the third-stage biquad filter 93. In particular, registers R2, R6, and R8 are specified as the operands of the IIRSUM instruction on the fourth line in FIG. 9. As a result of the execution of the IIRSUM instruction, B[4] stored in the least significant 16 bits of register R8 is overwritten with data C[4] subjected to filter operation.

The IIRSUM instruction on the fifth line in FIG. 9 instructs to execute a filter operation by the fourth-stage biquad filter 94. In particular, registers R3, R7, and R8 are specified as the operands of the IIRSUM instruction on the fifth line in FIG. 9. As a result of the execution of the IIRSUM instruction, C[4] stored in the least significant 16 bits of register R8 is overwritten with data Y[4] subjected to filter operation.

The ROR instruction on the sixth line in FIG. 9 indicates rightward cyclic shift processing which corresponds to the ROR instruction on the sixth line in FIG. 4. As a result of the execution of the ROR instruction, Y[4] obtained from the filter operation based on the IIRSUM instruction on the fifth line is moved to the most significant 16 bits of register R8 and X[5] appears in the least significant 16 bits of register R8.

The LOOP instruction on the seventh line in FIG. 9 is an instruction for determining whether the loop processing should be ended and corresponds to the LOOP instruction on the seventh line in FIG. 4. While the process for setting the initial value of register R9 is not shown in FIG. 9, "3h" may be set in register R9 as the initial value as in FIG. 4 and the loop processing from second to seventh lines may be repeated four times.

FIGS. 10 to 13 show changes in data held in registers R4 to R8 in the progress of the execution of four iterations of the loop processing from the second to seventh lines in FIG. 9. It is notable that only the least significant 16 bits of register R8 need to be overwritten to be updated in each iteration and the updated values are used as input data in the next IIRSUM instruction in the process of execution of the four IIRSUM instructions corresponding to the filter operations of four-stage biquad filters 91 to 94. That is, cyclic shifting in register R8 and load and store to a data memory 51 do not need to be performed between the four IIRSUM instructions.

Figure 14:
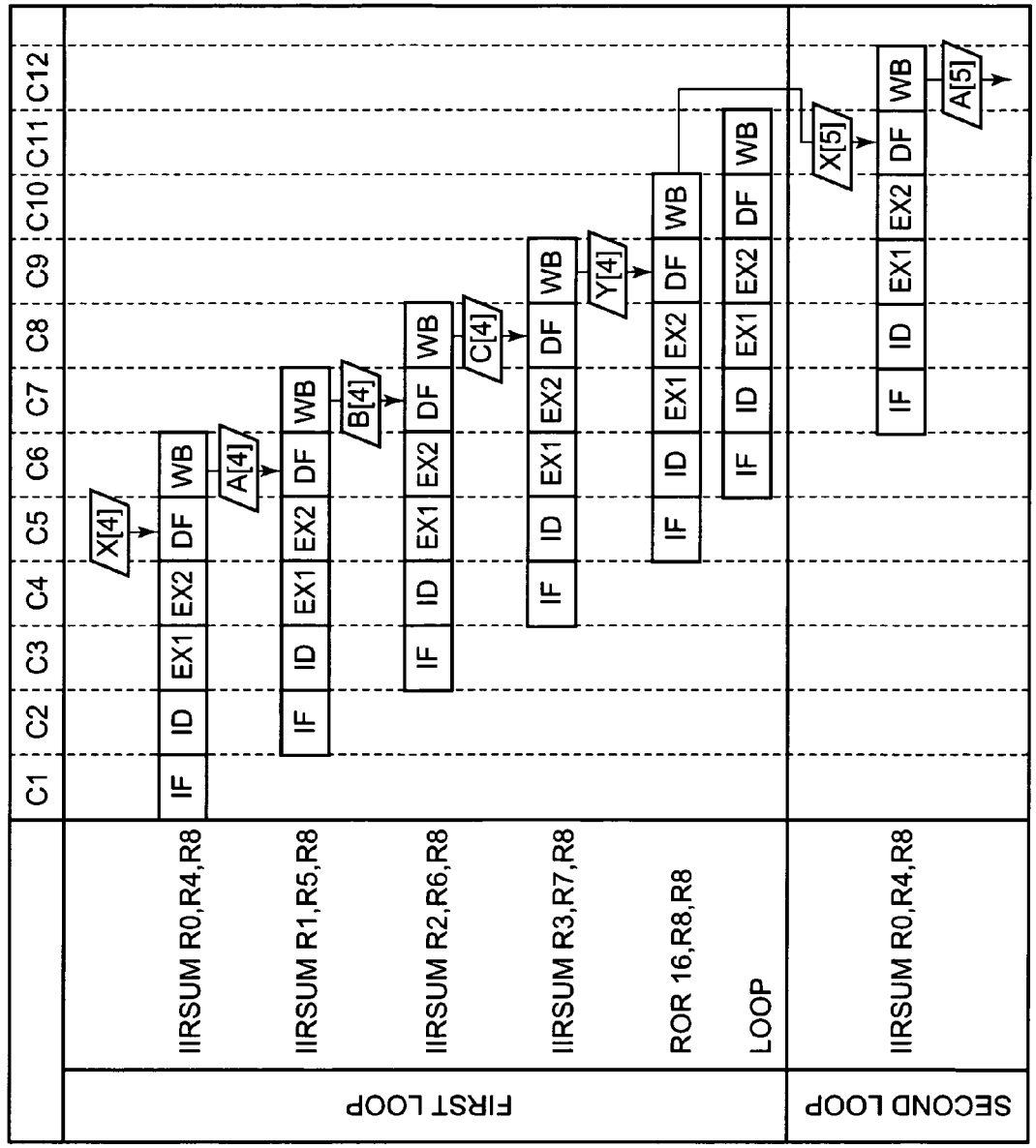
FIG. 14 is a diagram showing pipeline processing of IIR filter operation instructions according to the exemplary embodiment of the present invention.

In order to make fuller use of the advantage of the capability of successive execution of IIR filter operation instructions (IIRSUM instructions) as in the sample program shown in FIG. 9, the microprocessor 1 is preferably designed to have a pipeline structure. FIG. 14 shows pipeline processing of a set of instructions included in the program in FIG. 9.

The IF stage in FIG. 14 is a stage in which an execution controller 10 fetches an instruction from an instruction memory 50 or an instruction cache (not shown) in which instructions prefetched from an instruction memory 50 are stored. The ID stage is a stage in which the execution controller 10 decodes the fetched instruction. If the decoded instruction is an IIRSUM instruction, data specified as the first and second operands are read and provided to a filter operation circuit 13.

EX1, EX2, and DF stages are stages in which filter operations are executed by the filer operation circuit 13. The exemplary filter operation circuits 13 shown in FIGS. 3 and 7 are compatible with the three-stage pipeline in FIG. 14. In the DF stage, the third operand of the IRSUM instruction is read and provided to the filter operation circuit 13.

Finally, the WB stage is a write-back stage in which results of the operations in the EX1, EX2, and DF stages are stored in a general register file 12.

As shown in FIG. 14, for example, in the WB stage (cycle C6) of the first IIRSUM instruction in the first loop, data A[4] subjected to the operation is written back to register R8. At this time, the subsequent IIRSUM instruction is in the DF stage and can refer to the output data A[4] of the preceding IIRSUM instruction. That is, successive IIRSUM instructions can be successively executed with one clock pitch without causing a pipeline stall.

In order to ensure that successive IIRSUM instructions are executed with one clock pitch, a bypass circuit may be provided for providing data subjected to filter operation that appears at terminal OUT1 of the filter operation circuit 13 to terminal IN1 of the filter operation circuit without using a general register file 12.

In the forgoing description, only the examples have been described in which operations of biquad operations are performed by the filter operation circuit 13. However, the filter operation circuit 13 may be configured so as to execute filter operations that use a third or higher order IIR filter as a basic block. Operations of biquad filters having a configuration other than those shown in FIGS. 15 and 16 can also be performed by the filter operation circuit 13.

While the data memory 51 is external to the microprocessor 1 in the configuration shown in FIG. 1, the data memory 51 may be provided inside a microprocessor 1 which can, for example, be integrated in a single chip together with the data memory 51. The present invention is not limited to the specific implementation shown in order FIG. 1 but can be applied to various microprocessor implementations.

The present invention is not limited to the embodiment described above. It goes without saying that various modifications can be made without departing from the spirit of the present invention described above.

Further, it is noted that Applicant's intent is to encompass equivalents of all claim elements, even if amended later during prosecution.

What is claimed is:

1. A microprocessor comprising:
    a filter operation circuit which executes an infinite impulse response (IIR) filter operation by using a plurality of filter coefficients, and outputs one sample of data subjected to said IIR filter operation and a transfer data to be used in a next IIR filter operation;
    a first source register which provides the plurality of filter coefficients to be used in the IIR filter operation to the filter operation circuit;
    a second source register which provides a past transfer data to the IIR filter operation circuit, and is overwritten with a new transfer data output from the filter operation circuit; and
    a third source register which holds a plurality of samples of data to be subjected to the IIR filter operation, and provides the plurality of data to be subjected to the IIR filter operation to the filter operation circuit,
    wherein a storage area of the third source register for storing at least one sample to be subjected to the IIR filter operation is overwritten with the data subjected to the IIR filter operation output from the filter operation circuit, and
    wherein the third source register cyclically shifts the data held in the third source register in response to overwriting with said data output from the filter operation circuit.

2. The microprocessor according to claim 1, wherein the IIR filter operation by the filter operation circuit is performed in accordance with a filter operation instruction and the first to third source registers are specified by operands of the filter operation instruction.

3. The microprocessor according to claim 1, wherein the cyclic shifting in the third source register is performed in accordance with a cyclic shift instruction, in which a shiftwidth is equivalent to one sample.

4. The microprocessor according to claim 1, wherein:
    the data subjected to filter operation is stored in the third source register in sequence by a repetitive execution of the IIR filter operation by the filter operation circuit and the cyclic shifting in the third source register in which the shiftwidth is equivalent to one sample; and
    a data held in the third source register is output to an external memory at every M executions of the IIR filter operation and the cyclic shifting, where M is a positive integer less than or equal to N and N is the maximum number of samples that can be held in the third source register.

5. The microprocessor according to claim 1, wherein the IIR filter operation is expressed by $$P[n] = X[n] + \sum_{k=1}^{m} a_k \cdot P[n-k]$$

$$Y[n] = P[n] + \sum_{k=1}^{m} b_k \cdot P[n-k]$$

where X[n] is the n-th sample data to be subjected to filter operation, P[n] is the n-th sample transfer data, Y[n] is the n-th sample data subjected to filter operation, and $a_k$ and $b_k$ are the filter coefficients.

6. The microprocessor according to claim 1, wherein the transfer data includes the past data to be subjected to the IIR filter operation and the past data subjected to the IIR filter operation.

7. A method of performing an infinite impulse response (IIR) operation, comprising:

storing a plurality of sample data in a first register, said plurality of sample data being consecutive for IIR filter operation;

storing a filter coefficient corresponding to said plurality of sample data in a second register;

storing a transfer data corresponding to said plurality of sample data in a third register;

providing said plurality of sample data, said filter coefficient, and said transfer data to a filter operation circuit, executing an IIR operation in the filter operation circuit based on said plurality of sample data, said filter coefficient and said transfer data to obtain an executed sample data, one sample data of said plurality of sample data in said first register being replaced with said executed sample data; and cyclically shifting the data stored in said first register in response to replacing said one sample data with said executed sample data.

8. The method as claimed in claim 7, further comprising:

repeating said executing said IIR operation and said cyclically shifting by a number of said plurality of sample data.

* * * * *